(12) United States Patent
Tsukaguchi et al.

(10) Patent No.: US 6,613,450 B2
(45) Date of Patent: Sep. 2, 2003

(54) METAL/CERAMIC BONDING ARTICLE

(75) Inventors: Nobuyoshi Tsukaguchi, Shiojiri (JP);
Jyunji Nakamura, Shiojiri (JP);
Masahiko Wada, Shiojiri (JP); Makoto Namioka, Shiojiri (JP); Masami Kimura, Funabashi (JP)

(73) Assignee: Dowa Mining Co., Ltd., Tokyo (JP)

( * ) Notice: Subject to any disclaimer, the term of this patent is extended or adjusted under 35 U.S.C. 154(b) by 0 days.

(21) Appl. No.: 10/108,317

(22) Filed: Mar. 27, 2002

(65) Prior Publication Data

US 2003/0068532 A1 Apr. 10, 2003

(30) Foreign Application Priority Data

Sep. 28, 2001 (JP) .................................. P2001-304277

(51) Int. Cl.[7] .............................. C04B 37/02; B23L 1/00
(52) U.S. Cl. ..................... 428/621; 428/627; 428/629; 428/469; 428/698; 228/122.1; 228/124.5
(58) Field of Search ................ 428/621, 627, 428/629, 469, 698; 228/122.1, 124.5

(56) References Cited

U.S. PATENT DOCUMENTS 4,497,875 A * 2/1985 Arakawa et al. ............ 428/620
5,330,098 A * 7/1994 Mizuhara ..................... 228/214
5,561,321 A * 10/1996 Hirano et al. ................ 257/700
6,071,592 A * 6/2000 Sakuraba et al. ............ 428/141

FOREIGN PATENT DOCUMENTS

| JP | 2594475 | | 10/1991 |
| JP | 2797011 | | 11/1991 |
| JP | 403261669a | * | 11/1991 |
| JP | 404295065 A | * | 10/1992 |
| JP | 7-36467 | | 1/1993 |
| JP | 408290265a | * | 11/1996 |
| JP | 10-326949 | | 5/1997 |
| JP | 410518073a | * | 6/1998 |

* cited by examiner

Primary Examiner—Deborah Jones
Assistant Examiner—Stephen Stein
(74) Attorney, Agent, or Firm—Bachman & LaPointe, P.C.

(57) ABSTRACT

There is provided a metal/ceramic bonding article which ensures sufficient thermal shock resistance and has a substrate having a small outside dimension and which has both high reliability and compactness. The metal/ceramic bonding article comprises: a ceramic substrate; and a metal plate bonded to the ceramic substrate via a brazing filler metal, wherein the brazing filler metal protrudes from the bottom face of the metal plate by a length which is longer than 30 $\mu$m and which is 250 $\mu$m or less, or wherein the brazing filler metal protrudes from the bottom face of the metal plate by a length which is 25% or more of the thickness of the metal plate.

21 Claims, 6 Drawing Sheets

METAL/CERAMIC BONDING ARTICLE

BACKGROUND OF THE INVENTION

1. Field of the Invention

The present invention generally relates to a metal/ceramic bonding article having a ceramic substrate and a metal plate which is bonded to the ceramic substrate via a brazing filler metal. More specifically, the invention relates to a metal/ceramic bonding article on which parts, such as semiconductor parts, are mounted and which is used for a power module or a Peltier element module.

2. Description of the Prior Art

In a typical method for producing a ceramic circuit board for a power module or for mounting a semiconductor thereon, a metal plate and a ceramic substrate are first bonded to each other For example, there is industrially utilized the direct bonding method for arranging a copper plate on a ceramic substrate so as to allow the copper plate to directly contact the ceramic substrate and for heating the copper plate and the ceramic substrate in an inert gas to bond the ceramic substrate and the copper plate to each other. There is also industrially utilized the brazing and soldering method for arranging a copper plate on a ceramic substrate via a brazing filler metal containing an active metal, such as Ti, Zr or Hf, and for heating them in a vacuum to bond the ceramic substrate and the copper plate to each other. In the brazing and soldering method, the active metal concerns the bonding of the ceramic substrate to the metal plate, and the ceramic substrate reacts with the brazing filler metal to form a reaction product. It is generally considered that a brazing filler metal reacts with a ceramic substrate of an oxide, such as $Al_2O_3$, to form an oxide of an active metal, reacts with a ceramic substrate of a non-oxide, such as AlN or $Si_3N_4$, to form a nitride of an active metal, and reacts with a ceramic substrate of a carbide, such as SiC, to form a carbide of an active metal, so that the product bonds the ceramic substrate to the copper plate. That is, the brazing filler metal layer after bonding comprises a layer mainly containing the metal, and a layer mainly containing an interface product of the interface between the brazing filler metal and the ceramic substrate.

As a method for forming a predetermined circuit shape by patterning after bonding a metal plate, such as a copper plate, for a circuit or radiation, there is the etching method also utilized for a printed circuit board or the like. This method is widely utilized since it is easy to obtain a fine pattern and it is possible to relatively simply cope with the change of a circuit design. In this method, for example, a mixed solution of iron chloride or copper chloride, hydrochloric acid and hydrogen peroxide is usually used as an etchant for a metal plate, such as a copper plate. In the case of the above described direct bonding method, this etchant can carry out etching and patterning without causing problems since it is possible to ignore reaction products. However, in the case of the brazing and soldering method, this etchant can dissolve the metal plate, but it can not dissolve the brazing filler metal and a reaction product of the brazing filler metal with the ceramic substrate (the general term for the brazing filler metal and the reaction product will be hereinafter referred to as a "brazing filler metal and so forth"), so that the brazing filler metal and so forth remain between circuit patterns and/or on the edge face of the substrate. Since the brazing filler metal and so forth are conductors, it is not possible to satisfy basic characteristics of a circuit board to isolate the circuit patterns from each other and/or the surface and reverse of the board from each other. As a method for removing the brazing filler metal and so forth, there is known a method for using hydrofluoric acid alone or a mixed acid of hydrofluoric acid and at least one inorganic acid selected from the group consisting of nitric acid, sulfuric acid and hydrochloric acid, or using a solution containing aqua regia, sodium hydroxide and/or potassium hydroxide, to treat and remove the brazing filler metal and so forth (see Japanese Patent No. 2,594,475). There is also known a method for treating the brazing filler metal and so forth with a solution containing a hydrogen halide and/or an ammonium halide, and then, treating them with a solution containing an inorganic acid and hydrogen peroxide, to remove the brazing filler metal and so forth (see Japanese Publication No. 7-36467).

On the metal circuit portion of a metal/ceramic bonding substrate patterned by the above described processes, nickel plating, nickel alloy plating, gold plating or preservation is carried out in accordance with its purpose.

Moreover, chip parts, such as semiconductor parts, are mounted thereon by soldering or the like to be used as a power module or a Peltier element module.

In recent years, power modules and Peltier element modules are used in severer environment, and parts used for them are required to have high reliability. In particular, parts used as automotive parts or used outdoors are required to improve thermal shock resistance. On the other hand, for example, in some of metal/ceramic bonding substrates wherein a metal is bonded to a ceramic substrate via a brazing filler metal, characteristics are further improved by devising the sectional shape of the edge portions of a circuit pattern.

In order to enhance reliability against thermal shock and so forth by means of a brazing filler metal, it is known that protrusion of the brazing filler metal from edge portions of a metal plate is effective in relaxation of the thermal stress caused by the difference in coefficient of thermal expansion between metal and ceramic in the bonding of metal to ceramic. For example, Japanese Patent Laid-Open No. 10-326949 has proposed a substrate having a structure wherein the difference between the dimensions of the bottom and top faces of the peripheral edge portion of a metal circuit plate is in the range of from 50 $\mu$m to 100 $\mu$m (this difference is the distance between a plane perpendicular to the principal plane of a metal plate at one end of the bottom face of the metal plate and a plane perpendicular to the principal plane of the metal plate at one end of the top face of the metal plate on the same side as the one end of the bottom face of the metal plate, i.e., the length shown by L1 in FIG. 5 (it is assumed that a case where the area of the bottom face is greater than the area of the top face is positive (+)), and this distance will be hereinafter referred to as a "skirt spreading length"), and the length of a brazing filler metal protruding from the interface of the metal plate and the brazing filler metal bonded thereto (the length shown by L2 in FIG. 5), which will be hereinafter referred to as a "brazing filler metal protruding length", is in the range of from −50 $\mu$m to +30 $\mu$m. in addition, Japanese Patent 2,797,011 has proposed a substrate having a structure wherein a brazing filler metal protruding length from the interface between a metal plate and a brazing filler metal bonded thereto is 250 $\mu$m or more.

However, even if a brazing filler metal protruding length from the interface between a metal plate and a brazing filler metal bonded thereto is in the range of from −50 $\mu$m to +30 $\mu$m, it is not possible to obtain thermal shock resistance sufficient for market's demands. If a brazing filler metal protruding length from the interface between a metal plate and a brazing filler metal bonded thereto is 250 μm or more, it is possible to obtain sufficiently high thermal shock resistance. However, in the market trend remarkably emphasizing compactness and flexibility in recent years, if the brazing filler metal protruding length is so long, the outside dimension of a substrate is difficult to be allowable in design, so that it is required to provide thermal shock resistance standing comparison with that in the case of a protruding length of 250 μm even if the outside dimension is smaller.

SUMMARY OF THE INVENTION

It is therefore an object of the present invention to eliminate the aforementioned problems and to provide a metal/ceramic bonding article which ensures sufficient thermal shock resistance and has a substrate having a small outside dimension and which has both high reliability and compactness.

In order to accomplish the aforementioned and other objects, the inventors have diligently studied and found that it is possible to provide a metal/ceramic bonding article which ensure sufficient thermal shock resistance and has a substrate having a small outside dimension and which has both high reliability and compactness, by optimally controlling a brazing filler metal protruding length so as to be capable of designing a larger part mounting area. As a result, the inventors have made the present invention.

According to one aspect of the present invention, there is provided a metal/ceramic bonding article comprising: a ceramic substrate; and a metal plate bonded to the ceramic substrate via a brazing filler metal, wherein the brazing filler metal protrudes from the bottom face of the metal plate by a length which is longer than 30 μm and which is 250 μm or less.

According to another aspect of the present invention, there is provided a metal/ceramic bonding article comprising: a ceramic substrate; and a metal plate bonded to the ceramic substrate via a brazing filler metal, wherein the brazing filler metal protrudes from the bottom face of the metal plate by a length which is 25% or more of the thickness of the metal plate.

In each of the above described metal/ceramic bonding articles, the length of the protruding portion of the brazing filler metal may be in the range of from 50 μm to 200 μm. The distance between a plane perpendicular to the principal plane of the metal plate at one end of the bottom face of the metal plate and a plane perpendicular to the principal plane of the metal plate at one end of the top face of the metal plate on the same side as the one end of the bottom face of the metal plate may be 50 μm or less assuming that the distance is positive when the area of the bottom face is greater than the area of the top face. The ceramic substrate may be formed of a material selected from the group consisting of oxides, nitrides and carbides. The metal plate may be formed of a material selected from the group consisting of copper, aluminum, alloys containing copper as a principal component, and alloys containing aluminum as a principal component. The brazing filler metal may contain silver and an active metal. The brazing filler metal may include aluminum. The metal plate and the brazing filler metal may be treated by at least one of nickel plating, nickel alloy plating, gold plating and preservation.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Figure 1A:
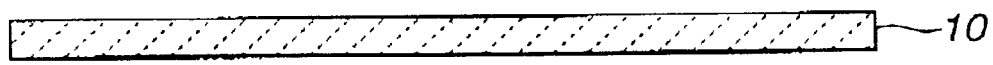
FIGS. 1A through 1C are sectional views showing steps of producing a metal/ceramic bonding article according to the present invention.

Referring now to the accompanying drawings, the preferred embodiment of a metal/ceramic bonding article according to the present invention will be described below.

The preferred embodiment of a metal/ceramic bonding article according to the present invention comprises a ceramic substrate and a metal plate which is bonded to the ceramic substrate via a brazing filler metal, wherein the length of the brazing filler metal protruding from the bottom face of the metal plate is longer than 30 μm and 250 μm or less, preferably in the range of from 50 μm to 200 μm, or the length of the brazing filler metal protruding from the bottom face of the metal plate is 25% or more, preferably 30% or more, of the thickness of the metal plate.

In the case of a metal circuit plate having a thickness of about 0.25 to 0.4 mm usually used for a power module, the degree of strength of a substrate deteriorated by a stress caused in the peripheral portion of the metal circuit plate during application of thermal shock is improved as the protruding length of the brazing filler metal increases, and sufficient thermal shock resistance is obtained if the protruding length of the brazing filler metal is 30 μm or more, preferably 50 μm or more. If the protruding length of the brazing filler metal is set to be as long as the design dimension of the substrate allows, it is possible to obtain high thermal shock resistance.

If the thickness of the metal circuit plate is about 0.15 mm or less, the strain stress to the substrate during thermal expansion and thermal contraction of the metal decreases. Therefore, even if the brazing filler metal protruding length from the interface between the metal circuit plate and the brazing filler metal is less than 30 μm, it is possible to maintain thermal shock resistance. The brazing filler metal protruding length is preferably 25% or more, more preferably 30% or more, of the thickness of the metal circuit portion. If the brazing filler metal protruding length is set to be as long as the design dimension of the substrate allows, it is possible to obtain high thermal shock resistance.

With respect to the materials of the ceramic substrate used in the present invention, $Al_2O_3$ (alumina) is characterized by inexpensiveness, AlN is characterized by good thermal conductivity through though it is expensiveness, and $Si_3N_4$ and SiC are characterized by high strength and high toughness. In accordance with these characteristics of ceramic substrates, $Al_2O_3$ can provide an inexpensive ceramic circuit board, AlN can utilize its excellent radiating performance to provide a ceramic circuit board suitable for a semiconductor having a high calorific value, such as a large power chip, and $Si_3N_4$ and SiC can utilize their excellent strength to provide a ceramic circuit board which has high thermal shock resistance and high environment resistance and which is used in severe environment, such as automotive vehicles.

The brazing filler metal used for bonding the metal plate to the ceramic substrate can be selected in accordance with physical properties of the metal of the metal plate and the ceramic of the ceramic substrate. If the metal plate is a copper plate and if the ceramic substrate is an AlN substrate or an $Al_2O_3$ substrate, the composition of the metal components of the brazing filler metal preferably comprises 65 to 99 wt % of Ag, 1 to 10 wt % of an active metal and the rest of substantially Cu. At least one kind of element selected from Ti or Zr may be added as the active metal, and a very small amount of fourth component, such as $TiO_2$, may be added for stress relaxation. The brazing filler metal may be arranged on the whole surface of the ceramic substrate, or may be arranged only at a predetermined place. Thus, the brazing filler metal may be selectively used in accordance with its use if necessary. The brazing filler metal to be arranged may have any form, such as a paste form or a foil form. If the metal plate is an aluminum plate, the metal components of the brazing filler metal are preferably metal components mainly containing aluminum, such as Al—Si or Al—Si—Ti, regardless of the form, such as a paste form or a foil form.

As the metal plate, a copper plate is often used in view of its good electrical conductivity. In general, there is used a method for covering the metal plate with a resist to etch the metal plate to form a predetermined circuit pattern.

As chemicals for removing the undesired portion of the brazing filler metal and so forth, chemicals for dissolving the brazing filler metal, such as a fluoride or chelate, may be used since the mixed solution of iron chloride or copper chloride, hydrochloric acid and hydrogen peroxide, which is usually utilized, can not sufficiently dissolve the brazing filler metal and so forth.

Since the brazing filler metal protruding length is nothing or a very short length in the state that the undesired portion of the brazing filler metal and so forth is removed with chemicals, it is required to further work to obtain a desired brazing filler metal protruding length. As a method for obtaining such a desired brazing filler metal protruding length, there may be used, e.g., a method for applying a resist, which is slightly smaller than a circuit pattern of an etched metal plate, on the surface of the circuit pattern to dissolve the metal plate by etching or chemical polishing to obtain a desired brazing filler metal protruding length. Furthermore, the brazing filler metal protruding length can also be greatly changed by etching or chemical polishing conditions, and can also be controlled by conditions, such as temperature and spray pressure. As another method for obtaining a desired brazing filler metal protruding length, there may be used a method for forming a brazing filler metal having a pattern shape, which expects a target brazing filler metal protruding length with respect to a target circuit pattern of a metal plate, on a ceramic substrate by printing or the like, and thereafter, bonding the metal plate, which has been worked so as to have a pattern shape by press working or etching, to the ceramic substrate via the brazing filler metal. However, the present invention should not be limited to these methods.

With respect to the dimensions of the bottom and top faces of the metal circuit portion, it is advantageous to mounting that the area of the top face for arranging thereon an Si chip is larger. However, it is difficult to form a small dimensional difference by etching which is usually carried out. In order to prevent the enhancement of the probability of discharge to the adjacent metal circuit portion, the difference between the dimensions of the bottom and top faces is preferably a minus dimensional difference (the area of the top face is larger than the area of the bottom face) to an extent that discharge is not caused, and 40 $\mu$m or less. This range is set by changing the etching process and/or etching conditions.

In order to improve the weather resistance of a metal plate to be formed as a circuit pattern on the surface of the metal/ceramic bonding circuit board and in order to prevent the deterioration with age of solder wettability thereof, nickel plating, nickel alloy plating, gold plating or preservation is preferably carried out. The plating process is carried out by, e.g., a usual electroless plating method which uses chemicals containing a hypophosphite as an Ni—P electroless plating solution after degreasing, chemical polishing and pretreatment by Pd activating chemicals, or a method for carrying out electroplating while causing an electrode to contact a pattern. Furthermore, preservation is preferably carried out by a usual azole compound.

On the metal circuit plate of the metal/ceramic bonding circuit board produced according to the present invention, electrical and electronic parts, such as semiconductor chips and resistors, are mounted by soldering or the like, and to the opposite face thereto, a radiating plate is bonded by soldering or the like. Moreover, steps of bonding a plastic case and so forth, connecting external terminals to the circuit board by ultrasonic bonding wires, injecting an insulating gel, and biding a top lid are carried out to complete a module.

Referring to the accompanying drawing, examples of a metal/ceramic bonding article according to the present invention will be described below in detail.

EXAMPLE 1

The weight of metal powder containing metal components was measured so that the components are 91 Ag-7 Cu-1.5 Ti-0.5 $TiO_2$ (wt %). To this metal powder, about 10% of an acrylic vehicle was added. By kneading this mixture by an automatic mortar and three roll mills by a usual method, a paste-like brazing filler metal was prepared.

Figure 1B:
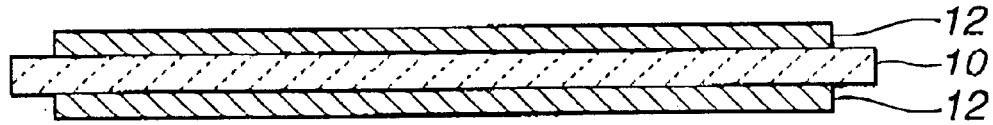
Figure 1C:
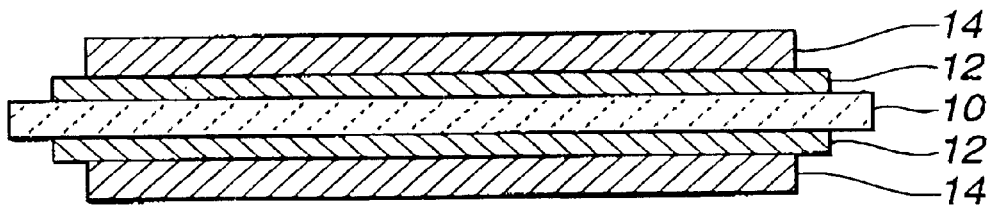

Then, as shown in FIGS. 1A through 1C, a ceramic substrate 10 was prepared (FIG. 1A), and the brazing filler metal 12 was applied on both faces of the ceramic substrate 10 by the screen printing (FIG. 1B). Then, copper plates 14 having a thickness of 0.25 mm were arranged on both side thereof, and the copper plates 14 were bonded to the ceramic substrate 10 at 835° C. in a vacuum furnace. In order to verify the thickness of the brazing filler metal 12, the sample thus bonded was cut to measure the thickness of the brazing filler metal 12. As a result, the thickness of the brazing filler metal 12 was about 20 $\mu$m. As the ceramic substrate 10, an S grade AlN substrate produced by ATG company was used.

Figure 2A:
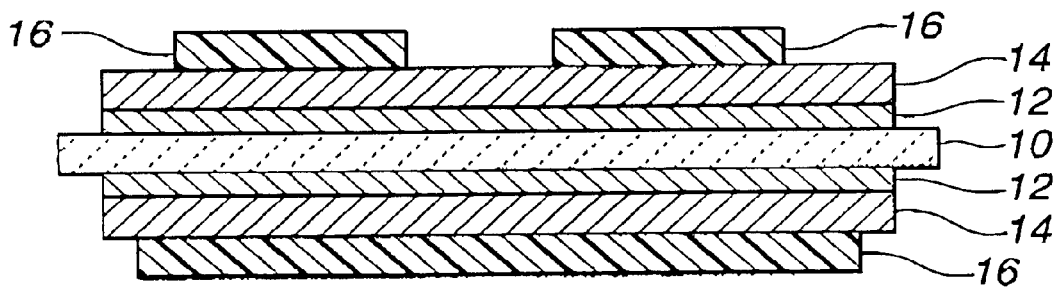
FIGS. 2A through 2C are sectional views showing steps of producing a metal/ceramic bonding article according to the present invention.
Figure 2B:
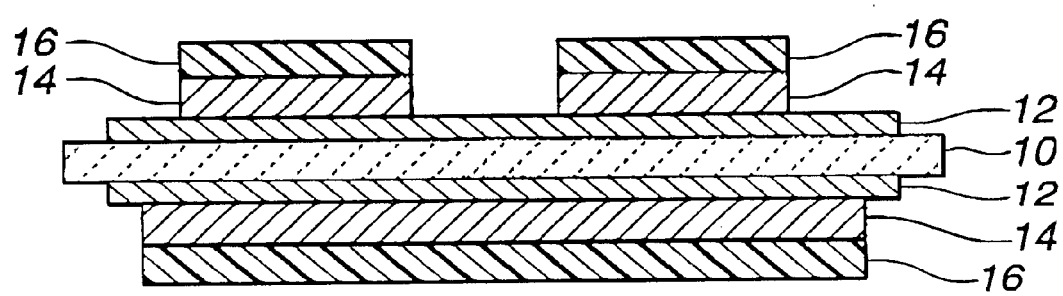
Figure 2C:
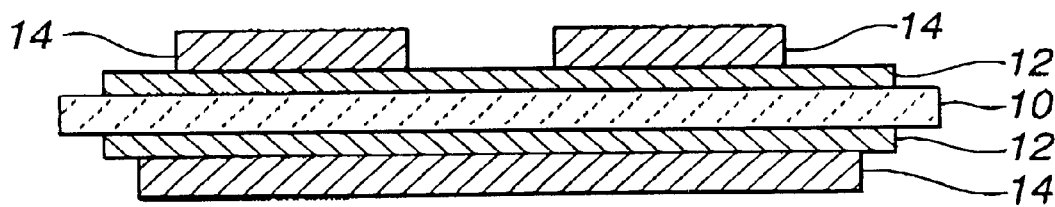

Thereafter, the sample thus bonded was taken out of the vacuum furnace. Then, as shown in FIGS. 2A through 2C, ultraviolet curing alkali peeling resists 16 having a desired circuit pattern and a thickness of 10 to 15 μm were applied on both faces of the bonded copper plates 14 (FIG. 2A), and undesired portions of the copper plates 14 were removed with an etchant comprising copper chloride, hydrogen peroxide and hydrochloric acid (FIG. 2B). Thereafter, the resists 16 were removed with an aqueous solution of 3.5% sodium hydroxide (FIG. 2C).

Figure 3A:
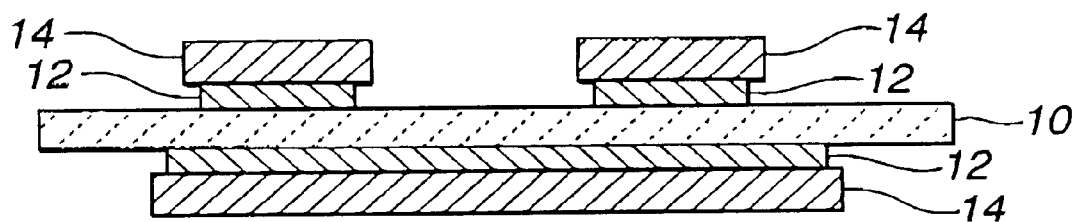
FIGS. 3A through 3C are sectional views showing steps of producing a metal/ceramic bonding article according to the present invention.
Figure 3B:
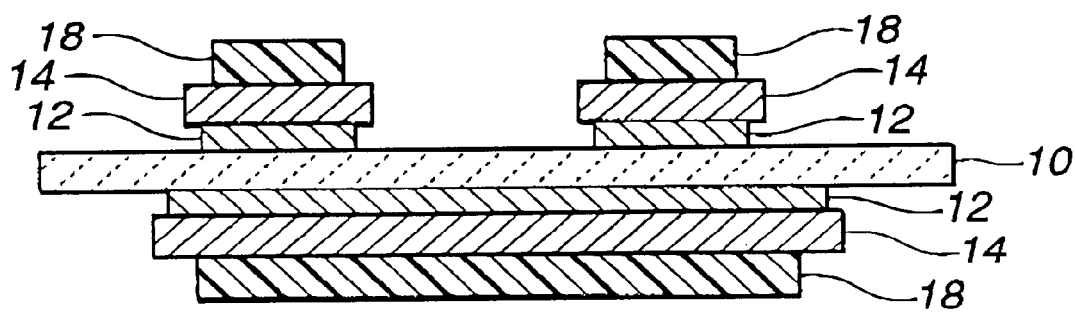
Figure 3C:
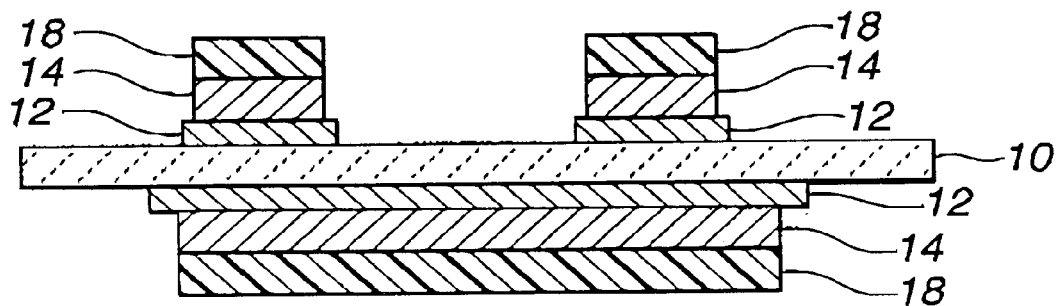
Figure 4A:
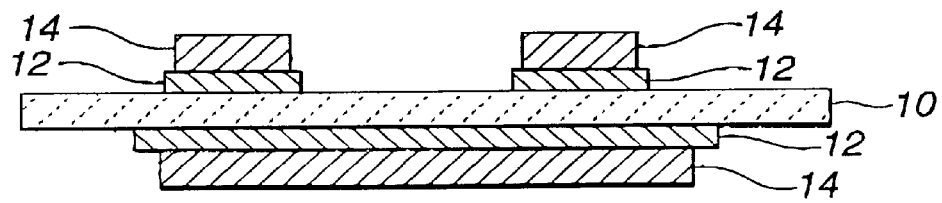
FIGS. 4A and 4C are sectional views showing steps of producing a metal/ceramic bonding article according to the present invention.
Figure 4B:
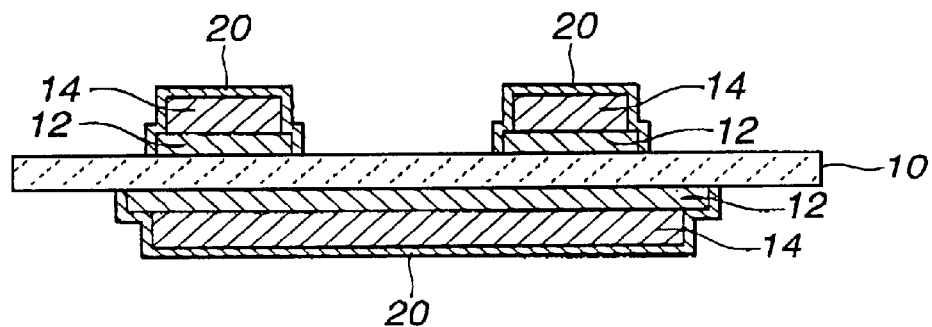
Figure 5:
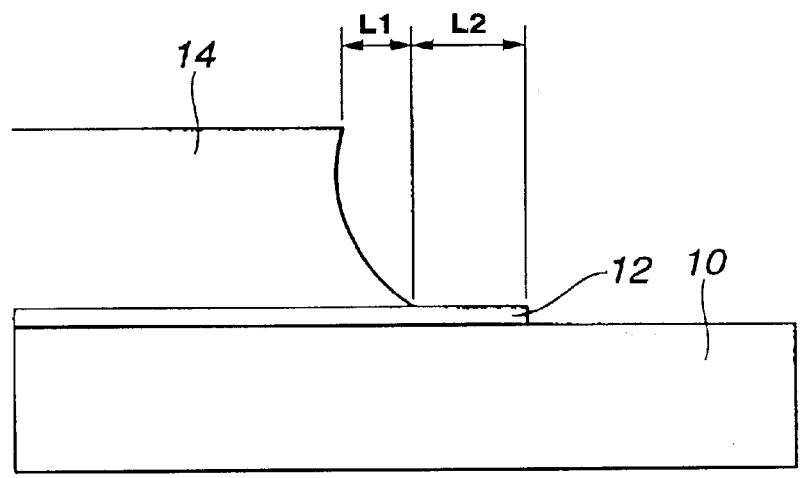
FIG. 5 is a schematic view for explaining a skirt spreading length and a brazing filler metal protruding length.

Then, in order to remove undesired portions of the brazing filler metal between circuit patterns and on the edge faces of the substrate, the sample was dipped in a mixed solution containing 1.4% EDTA, 6% hydrogen peroxide and 3% ammonia to remove undesired portions of the brazing filler metal 12 (FIG. 3A). Thereafter, ultraviolet curing alkali peeling resists 18 having a desired circuit pattern were applied on both faces of the copper plates 14 again (FIG. 3B), and the copper plates 14 were etched again for 15 minutes with an etchant comprising copper chloride, hydrogen peroxide and hydrochloric acid (FIG. 3C). Thereafter, the resists 18 were removed with an aqueous solution of 3.5% sodium hydroxide (FIG. 4A), and an Ni—P electroless plating 20 was carried out (FIG. 4B).

Figure 6:
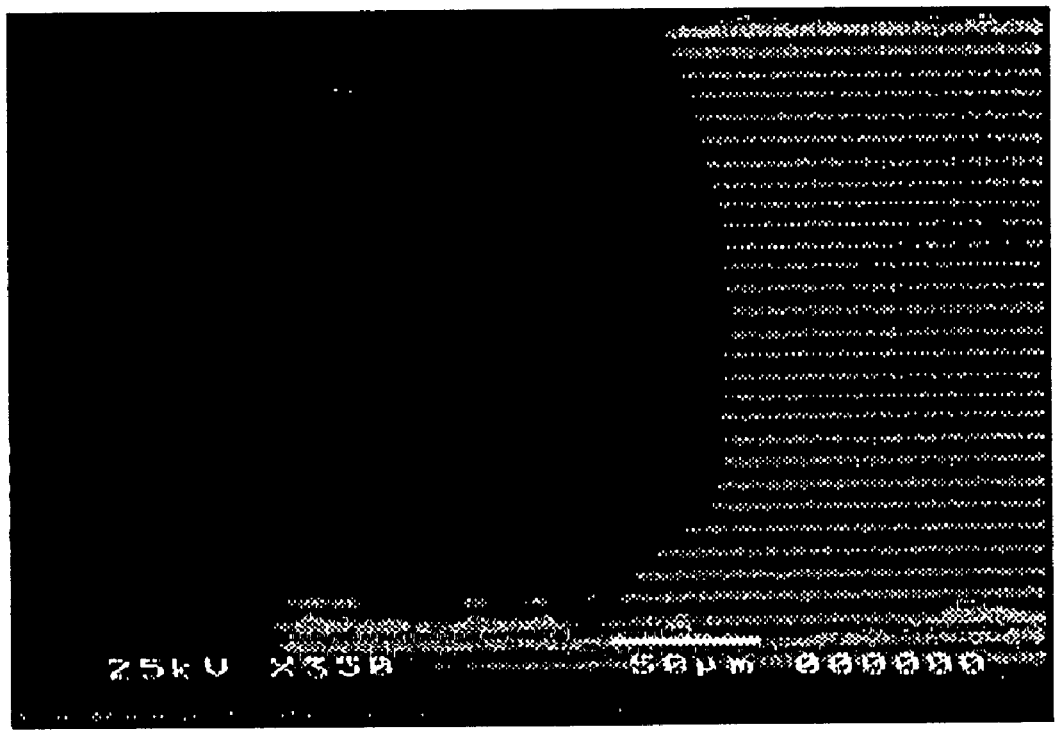
FIG. 6 is a photomicrograph showing a cross section of a metal/ceramic bonding article obtained in Example 1.

FIG. 6 shows a photomicrograph of a cross section of the metal/ceramic bonding article thus obtained. With respect to the metal/ceramic bonding article obtained in this Example, the brazing filler metal protruding length and the skirt spreading length of the metal circuit portion were measured, so that the lengths were 102 μm and <0 μm, respectively. With respect to the metal/ceramic bonding article obtained in this Example, a furnace passing treatment (a treatment for cooling the article after heating the article at 370° C. for ten minutes in a reducing atmosphere (nitrogen 4+hydrogen 1)) was carried out, and reliability was evaluated by a furnace passing resistance (number). That is, it was visually inspected whether a crack occurred in the ceramic portion after the furnace passing treatment, and it was assumed that the number of furnace passing treatments immediately before the number of furnace passing treatments causing a crack was a furnace passing resistance (number). By this furnace passing resistance, the reliability of the metal/ceramic bonding article was evaluated. As a result, the furnace passing resistance (number) of the metal/ceramic bonding article produced in this Example was 58.

EXAMPLE 2

By the same method as that in Example 1, a metal/ceramic bonding article having a brazing filler metal protruding length of 101 μm and a metal circuit portion having a skirt spreading length of <0 μm was obtained. With respect to the metal/ceramic bonding article obtained in this Example, a furnace passing treatment was carried out, and reliability was evaluated by a furnace passing resistance (number). As a result, the furnace passing resistance (number) was 58.

EXAMPLE 3

By the same method as that in Example 1, a metal/ceramic bonding article having a brazing filler metal protruding length of 95 μm and a metal circuit portion having a skirt spreading length of 3 μm was obtained. With respect to the metal/ceramic bonding article obtained in this Example, a furnace passing treatment was carried out, and reliability was evaluated by a furnace passing resistance (number). As a result, the furnace passing resistance (number) was 68.

EXAMPLE 4

By the same method as that in Example 1 except that the second etching was carried out for twenty minutes, a metal/ceramic bonding article having a brazing filler metal protruding length of 124 μm and a metal circuit portion having a skirt spreading length of <0 μm was obtained. With respect to the metal/ceramic bonding article obtained in this Example, a furnace passing treatment was carried out, and reliability was evaluated by a furnace passing resistance (number). As a result, the furnace passing resistance (number) was 84.

EXAMPLE 5

By the same method as that in Example 1, a metal/ceramic bonding article having a brazing filler metal protruding length of 88 μm and a metal circuit portion having a skirt spreading length of 11 μm was obtained. With respect to the metal/ceramic bonding article obtained in this Example, a furnace passing treatment was carried out, and reliability was evaluated by a furnace passing resistance (number). As a result, the furnace passing resistance (number) was 78. In addition, with respect to the metal/ceramic bonding article obtained in this Example, a bending strength measuring device (SHIMADZU AGS-1000D, produced by Shimadzu Seisakusho) was used for measuring an initial bending strength and a bending strength after three passages through furnace, on measurement conditions of a load speed of 0.5 mm/min and a span length of 30 mm. As a result, the initial bending strength was 615 MPa, and the bending strength after three passages through furnace was 535 MPa.

EXAMPLE 6

By the same method as that in Example 4, a metal/ceramic bonding article having a brazing filler metal protruding length of 133 μm and a metal circuit portion having a skirt spreading length of <0 μm was obtained. With respect to the metal/ceramic bonding article obtained in this Example, a furnace passing treatment was carried out, and reliability was evaluated by a furnace passing resistance (number). As a result, the furnace passing resistance (number) was 98.

EXAMPLE 7

By the same method as that in Example 1 except that the second etching was carried out for ten minutes, a metal/ceramic bonding article having a brazing filler metal protruding length of 73 μm and a metal circuit portion having a skirt spreading length of 8 μm was obtained. With respect to the metal/ceramic bonding article obtained in this Example, a furnace passing treatment was carried out, and reliability was evaluated by a furnace passing resistance (number). As a result, the furnace passing resistance (number) was 74.

EXAMPLE 8

By the same method as that in Example 1, a metal/ceramic bonding article having a brazing filler metal protruding length of 82 μm and a metal circuit portion having a skirt spreading length of 4 μm was obtained. With respect to the metal/ceramic bonding article obtained in this Example, a furnace passing treatment was carried out, and reliability was evaluated by a furnace passing resistance (number). As a result, the furnace passing resistance (number) was 58. In addition, with respect to the metal/ceramic bonding article obtained in this Example, an initial bending strength and a bending strength after three passages through furnace were measured similar to Example 5. As a result, the initial bending strength was 609 MPa, and the bending strength after three passages through furnace was 570 MPa.

EXAMPLE 9

By the same method as that in Example 1, a metal/ceramic bonding article having a brazing filler metal protruding length of 83 μm and a metal circuit portion having a skirt spreading length of 11 μm was obtained. With respect to the metal/ceramic bonding article obtained in this Example, a furnace passing treatment was carried out, and reliability was evaluated by a furnace passing resistance (number). As a result, the furnace passing resistance (number) was 42.

EXAMPLE 10

By the same method as that in Example 1, a metal/ceramic bonding article having a brazing filler metal protruding length of 93 μm and a metal circuit portion having a skirt spreading length of 5 μm was obtained. With respect to the metal/ceramic bonding article obtained in this Example, a furnace passing treatment was carried out, and reliability was evaluated by a furnace passing resistance (number). As a result, the furnace passing resistance (number) was 52.

EXAMPLE 11

By the same method as that in Example 7, a metal/ceramic bonding article having a brazing filler metal protruding length of 65 μm and a metal circuit portion having a skirt spreading length of 21 μm was obtained. With respect to the metal/ceramic bonding article obtained in this Example, a furnace passing treatment was carried out, and reliability was evaluated by a furnace passing resistance (number). As a result, the furnace passing resistance (number) was 32.

EXAMPLE 12

By the same method as that in Example 7, a metal/ceramic bonding article having a brazing filler metal protruding length of 53 μm and a metal circuit portion having a skirt spreading length of 23 μm was obtained. With respect to the metal/ceramic bonding article obtained in this Example, a furnace passing treatment was carried out, and reliability was evaluated by a furnace passing resistance (number). As a result, the furnace passing resistance (number) was 32.

EXAMPLE 13

By the same method as that in Example 7, a metal/ceramic bonding article having a brazing filler metal protruding length of 62 μm and a metal circuit portion having a skirt spreading length of 31 μm was obtained. With respect to the metal/ceramic bonding article obtained in this Example, a furnace passing treatment was carried out, and reliability was evaluated by a furnace passing resistance (number). As a result, the furnace passing resistance (number) was 32.

EXAMPLE 14

By the same method as that in Example 7, a metal/ceramic bonding article having a brazing filler metal protruding length of 54 μm and a metal circuit portion having a skirt spreading length of 15 μm was obtained. With respect to the metal/ceramic bonding article obtained in this Example, a furnace passing treatment was carried out, and reliability was evaluated by a furnace passing resistance (number). As a result, the furnace passing resistance (number) was 40.

EXAMPLE 15

By the same method as that in Example 7, a metal/ceramic bonding article having a brazing filler metal protruding length of 57 μm and a metal circuit portion having a skirt spreading length of 26 μm was obtained. With respect to the metal/ceramic bonding article obtained in this Example, a furnace passing treatment was carried out, and reliability was evaluated by a furnace passing resistance (number). As a result, the furnace passing resistance (number) was 26.

EXAMPLE 16

By the same method as that in Example 7, a metal/ceramic bonding article having a brazing filler metal protruding length of 55 μm and a metal circuit portion having a skirt spreading length of 25 μm was obtained. With respect to the metal/ceramic bonding article obtained in this Example, a furnace passing treatment was carried out, and reliability was evaluated by a furnace passing resistance (number). As a result, the furnace passing resistance (number) was 30.

EXAMPLE 17

By the same method as that in Example 7, a metal/ceramic bonding article having a brazing filler metal protruding length of 55 μm and a metal circuit portion having a skirt spreading length of 26 μm was obtained. With respect to the metal/ceramic bonding article obtained in this Example, a furnace passing treatment was carried out, and reliability was evaluated by a furnace passing resistance (number). As a result, the furnace passing resistance (number) was 32.

EXAMPLE 18

By the same method as that in Example 4, a metal/ceramic bonding article having a brazing filler metal protruding length of 134 μm and a metal circuit portion having a skirt spreading length of <0 μm was obtained. With respect to the metal/ceramic bonding article obtained in this Example, a furnace passing treatment was carried out, and reliability was evaluated by a furnace passing resistance (number). As a result, the furnace passing resistance (number) was 92.

EXAMPLE 19

By the same method as that in Example 7, a metal/ceramic bonding article having a brazing filler metal protruding length of 52 μm and a metal circuit portion having a skirt spreading length of 18 μm was obtained. With respect to the metal/ceramic bonding article obtained in this Example, a furnace passing treatment was carried out, and reliability was evaluated by a furnace passing resistance (number). As a result, the furnace passing resistance (number) was 26. In addition, with respect to the metal/ceramic bonding article obtained in this Example, an initial bending strength and a bending strength after three passages through furnace were measured similar to Example 5. As a result, the initial bending strength was 622 MPa, and the bending strength after three passages through furnace was 549 MPa.

EXAMPLE 20

By the same method as that in Example 7, a metal/ceramic bonding article having a brazing filler metal protruding length of 62 μm and a metal circuit portion having a skirt spreading length of 10 μm was obtained. With respect to the metal/ceramic bonding article obtained in this Example, a furnace passing treatment was carried out, and reliability was evaluated by a furnace passing resistance (number). As a result, the furnace passing resistance (number) was 36.

EXAMPLE 21

By the same method as that in Example 7, a metal/ceramic bonding article having a brazing filler metal protruding length of 62 μm and a metal circuit portion having a skirt spreading length of 20 μm was obtained. With respect to the metal/ceramic bonding article obtained in this Example, a furnace passing treatment was carried out, and reliability was evaluated by a furnace passing resistance (number). As a result, the furnace passing resistance (number) was 38.

Comparative Example 1

By the same method as that in Example 1 except that the second etching was carried out for five minutes, a metal/ceramic bonding article having a brazing filler metal protruding length of −20 μm and a metal circuit portion having a skirt spreading length of 45 μm was obtained. With respect to the metal/ceramic bonding article obtained in this Example, a furnace passing treatment was carried out, and reliability was evaluated by a furnace passing resistance (number). As a result, the furnace passing resistance (number) was 11 which was smaller than those in Examples 1 through 21. In addition, with respect to the metal/ceramic bonding article obtained in this Example, an initial bending strength and a bending strength after three passages through furnace were measured similar to Example 5. As a result, the initial bending strength was 548 MPa, and the bending strength after three passages through furnace was 203 MPa. Both strengths were weaker than those in Examples 5, 8 and 19.

Comparative Example 2

By the same method as that in Example 1, a metal/ceramic bonding article having a brazing filler metal protruding length of 0 μm and a metal circuit portion having a skirt spreading length of 30 μm was obtained. With respect to the metal/ceramic bonding article obtained in this Example, a furnace passing treatment was carried out, and reliability was evaluated by a furnace passing resistance (number). As a result, the furnace passing resistance (number) was 19 which was smaller than those in Examples 1 through 21. In addition, with respect to the metal/ceramic bonding article obtained in this Example, an initial bending strength and a bending strength after three passages through furnace were measured similar to Example 5. As a result, the initial bending strength was 590 MPa, and the bending strength after three passages through furnace was 331 MPa. Both strengths were weaker than those in Examples 5, 8 and 19.

Comparative Example 3

By the same method as that in Example 1, a metal/ceramic bonding article having a brazing filler metal protruding length of 30 μm and a metal circuit portion having a skirt spreading length of 15 μm was obtained. With respect to the metal/ceramic bonding article obtained in this Example, a furnace passing treatment was carried out, and reliability was evaluated by a furnace passing resistance (number). As a result, the furnace passing resistance (number) was 25 which was smaller than those in Examples 1 through 21. In addition, with respect to the metal/ceramic bonding article obtained in this Example, an initial bending strength and a bending strength after three passages through furnace were measured similar to Example 5. As a result, the initial bending strength was 610 MPa, and the bending strength after three passages through furnace was 510 MPa. Both strengths were weaker than those in Examples 5, 8 and 19.

The results in Examples 1 through 21 and Comparative Examples 1 through 3 are shown in the following Table.

TABLE

| | Protruding Length (μm) | Skirt Spreading Length (μm) | Furnace Passing Resistance (Number) | Initial Bending Strength (MPa) | Bending Strength After Three Passages Through Furnace (MPa) |
|---|---|---|---|---|---|
| Ex. 1 | 102 | <0 | 58 | | |
| Ex. 2 | 101 | <0 | 58 | | |
| Ex. 3 | 95 | 3 | 68 | | |
| Ex. 4 | 124 | <0 | 84 | | |
| Ex. 5 | 88 | 11 | 78 | 615 | 535 |
| Ex. 6 | 133 | <0 | 98 | | |
| Ex. 7 | 73 | 8 | 74 | | |
| Ex. 8 | 82 | 4 | 58 | 609 | 570 |
| Ex. 9 | 83 | 11 | 42 | | |
| Ex. 10 | 93 | 5 | 52 | | |
| Ex. 11 | 65 | 21 | 32 | | |
| Ex. 12 | 53 | 23 | 32 | | |
| Ex. 13 | 62 | 31 | 32 | | |
| Ex. 14 | 54 | 15 | 40 | | |
| Ex. 15 | 54 | 26 | 26 | | |
| Ex. 16 | 55 | 25 | 30 | | |
| Ex. 17 | 55 | 26 | 32 | | |
| Ex. 18 | 134 | <0 | 92 | | |
| Ex. 19 | 52 | 18 | 26 | 622 | 549 |
| Ex. 20 | 62 | 10 | 36 | | |
| Ex. 21 | 62 | 20 | 38 | | |
| Comp. Ex. 1 | −20 | 45 | 11 | 548 | 203 |
| Comp. Ex. 2 | 0 | 30 | 19 | 590 | 331 |
| Comp. Ex. 3 | 30 | 15 | 25 | 610 | 510 |

Figure 7:
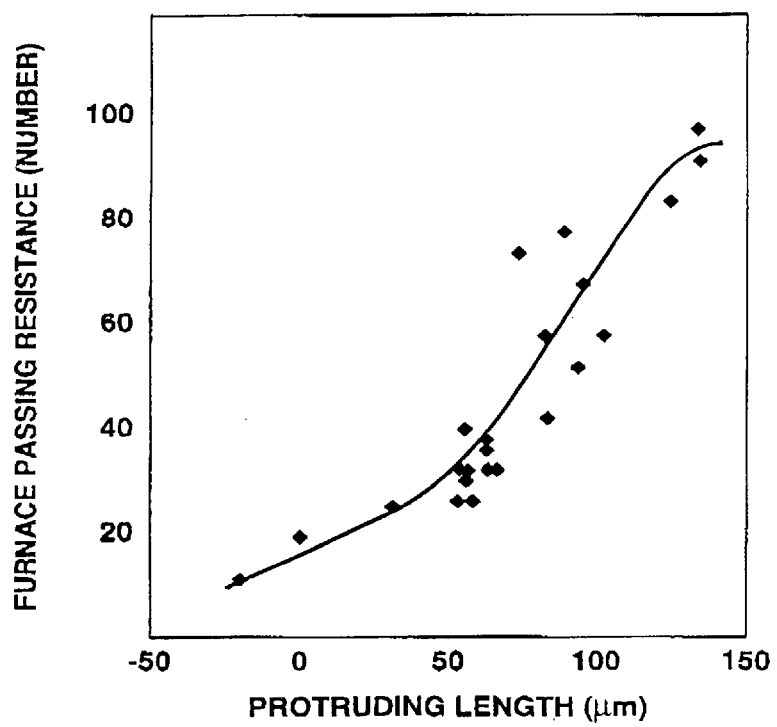
FIG. 7 is a graph showing the relationship between the brazing filler metal protruding length (μm) and the furnace passing resistance (number) in Examples and Comparative Examples.
Figure 8:
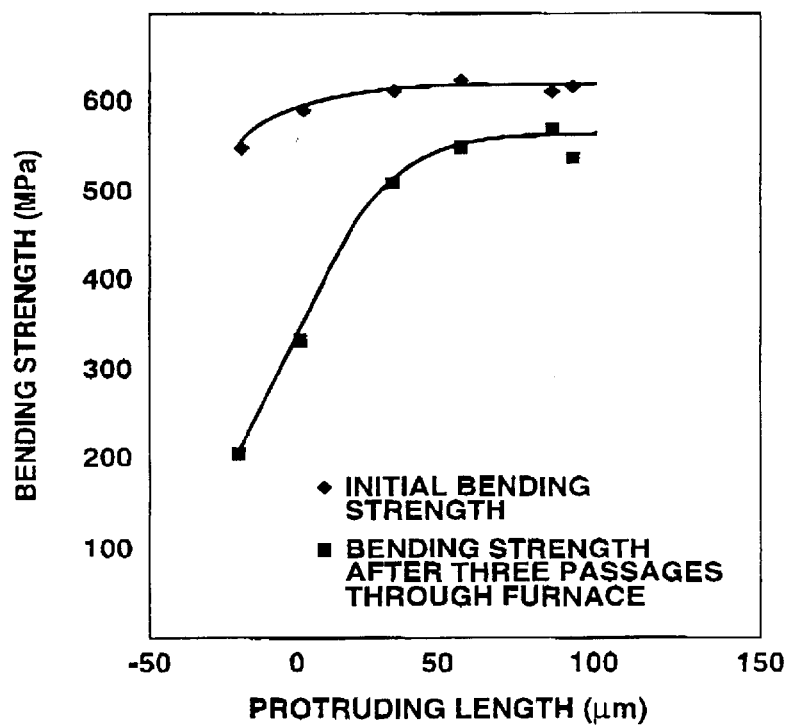
FIG. 8 is a graph showing the relationship between the brazing filler metal protruding length (μm) and the bending strengths (MPa) in Examples and Comparative Examples.

FIGS. 7 and 8 show the relationship between the brazing filler metal protruding length (μm) and the furnace passing resistance (number), and the relationship between the brazing filler metal protruding length (μm) and the bending strength (MPa), respectively. As shown in FIG. 7, if the brazing filler metal protruding length exceeds about 30 μm, the furnace passing resistance rapidly increases, and if the brazing filler metal protruding length exceeds about 130 μm, the variation in furnace passing resistance decreases. In addition, as shown in FIG. 8, if the brazing filler metal protruding length exceeds about 30 μm, the difference between the initial bending strength and the bending strength after three passages through furnace becomes small. Therefore, it can be seen that the thermal shock resistance can be greatly improved if the brazing filler metal protruding length is greater than about 30 μm.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A metal/ceramic bonding article comprising:
   a ceramic substrate; and
   a metal plate bonded to said ceramic substrate via a brazing filler metal,
   wherein said brazing filler metal protrudes from the bottom face of said metal plate by a length which is longer than 30 μm and which is less than 250 μm.

2. A metal/ceramic bonding article as set forth in claim 1, wherein said length is in the range of from 50 μm to 200 μm.

3. A metal/ceramic bonding article as set forth in claim 1, wherein the distance between a plane perpendicular to the principal plane of said metal plate at one end of the bottom face of said metal plate and a plane perpendicular to the principal plane of said metal plate at one end of the top face of said metal plate on the same side as the one end of the bottom face of the metal plate is 50 μm or less assuming that the distance is positive when the area of the bottom face is greater than the area of the top face.

4. A metal/ceramic bonding article as set forth in claim 1, wherein said ceramic substrate is formed of a material selected from the group consisting of oxides, nitrides and carbides.

5. A metal/ceramic bonding article as set forth in claim 1, wherein said metal plate is formed of a material selected from the group consisting of copper, aluminum, alloys containing copper as a principal components and alloys containing aluminum as a principal component.

6. A metal/ceramic bonding article as set forth in claim 1, wherein said brazing filler metal contains silver and an active metal.

7. A metal/ceramic bonding article as set forth in claim 1, wherein said brazing filler metal includes aluminum.

8. A metal/ceramic bonding article as set forth in claim 1, wherein said metal plate and said brazing filler metal are treated by at least one of nickel plating, nickel alloy plating and gold plating.

9. A metal/ceramic bonding article comprising:
a ceramic substrate; and
a metal plate bonded to said ceramic substrate via a brazing filler metal,
wherein said brazing filler metal protrudes from the bottom face of said metal plate by a length which is in the range of from 25% to 80% of the thickness of said metal plate.

10. A metal/ceramic bonding article as set forth in claim 9, wherein said length is 30% or more of the thickness of said metal plate.

11. A metal/ceramic bonding article as set forth in claim 9, wherein the distance between a plane perpendicular to the principal plane of said metal plate at one end of the bottom face of said metal plate and a plane perpendicular to the principal plane of said metal plate at one end of the top face of said metal plate on the same side as the one end of the bottom face of the metal plate is 50 μm or less assuming that the distance is positive when the area of the bottom face is greater than the area of the top face.

12. A metal/ceramic bonding article as set forth in claim 9, wherein said ceramic substrate is formed of a material selected from the group consisting of oxides, nitrides and carbides.

13. A metal/ceramic bonding article as set forth in claim 9, wherein said metal plate is formed of a material selected from the group consisting of copper, aluminum, alloys containing copper as a principal component, and alloys containing aluminum as a principal component.

14. A metal/ceramic bonding article as set forth in claim 9, wherein said brazing filler metal contains silver and an active metal.

15. A metal/ceramic bonding article as set forth in claim 9, wherein said brazing filler metal includes aluminum.

16. A metal/ceramic bonding article as set forth in claim 9, wherein said metal plate and said brazing filler metal are treated by at least one of nickel plating, nickel alloy plating and gold plating.

17. A metal/ceramic bonding article as set forth in claim 9, wherein said metal plate and said brazing filler metal are treated by preservation.

18. A metal/ceramic bonding article as set forth in claim 1, wherein said metal plate and said brazing filler metal are treated by preservation.

19. A metal/ceramic bonding article comprising:
a ceramic substrate; and
a metal plate bonded to said ceramic substrate via a brazing filler metal,
wherein said brazing filler metal protrudes from the bottom face of said metal plate by a length which is 25% or more of the thickness of said metal plate, and
wherein the distance between a plane perpendicular to the principal plane of said metal plate at one end of the bottom face of said metal plate and a plane perpendicular to the principal plane of said metal plate at one end of the top face of said metal plate on the same side as the one end of the bottom face of the metal plate is 50 μm or less assuming that the distance is positive when the area of the bottom face is greater than the area of the top face.

20. A metal/ceramic bonding article as set forth in claim 9, wherein said length is 70% or less of the thickness of said metal plate.

21. A metal/ceramic bonding article as set forth in claim 9, wherein said length is 60% or less of the thickness of said metal plate.

* * * * *